(12) United States Patent
Abelé

(10) Patent No.: US 7,859,031 B2
(45) Date of Patent: Dec. 28, 2010

(54) LIGHT MODULATING SENSING MOSFET TRANSISTOR AND PROCESS FOR MANUFACTURING THE SAME

(75) Inventor: Nicolas Abelé, Paris (FR)

(73) Assignee: STMicroelectronics S.A., Montrouge (FR)

(*) Notice: Subject to any disclaimer, the term of this patent is extended or adjusted under 35 U.S.C. 154(b) by 402 days.

(21) Appl. No.: 12/120,064

(22) Filed: May 13, 2008

(65) Prior Publication Data
US 2009/0121265 A1 May 14, 2009

(30) Foreign Application Priority Data
May 14, 2007 (FR) .................................. 07 03448

(51) Int. Cl.
*H01L 31/113* (2006.01)
*H01L 21/00* (2006.01)

(52) U.S. Cl. .............................. 257/290; 257/E31.073; 257/E21.395; 257/E21.401; 438/57; 438/69

(58) Field of Classification Search ................. 257/290, 257/E31.073, E21.395, E21.401; 438/57, 438/69
See application file for complete search history.

(56) References Cited

U.S. PATENT DOCUMENTS

| 3,459,944 A | 8/1969 | Triebwasser |
| 2002/0047564 A1 | 4/2002 | Ham et al. |

*Primary Examiner*—Evan Pert
(74) *Attorney, Agent, or Firm*—Lisa K. Jorgenson; Robert Iannucci; Seed IP Law Group PLLC

(57) ABSTRACT

A Light Modulating sensing MOSFET transistor includes: a substrate receiving light radiation, the substrate having two source and drain areas separated by a channel extending along a first direction; a gate conductive beam extending along a second direction being substantially perpendicular to the first direction, the beam being fixed at each of its two opposite ends on at least one supporting area and being located above the channel area, the gate beam being substantially opaque and flexible so as to perform progressive modulation of the light reaching the channel in accordance with its bending controlled by the difference of voltage between the gate and the bulk and causing the beam to bend and to come closer to the surface of the channel. A process for manufacturing a light Modulating sensing MOSFET transistor is also provided.

20 Claims, 9 Drawing Sheets

LIGHT MODULATING SENSING MOSFET TRANSISTOR AND PROCESS FOR MANUFACTURING THE SAME

TECHNICAL FIELD

The present disclosure generally relates to microelectronic circuits, and more particularly but not exclusively to a light modulating sensing MOSFET transistor and a process for making the same.

BACKGROUND INFORMATION

FIG. 1 illustrates a known device for modulating light, described in U.S. Patent Application Publication No. 2002047564 filed on behalf of LG PHILIPS LCD Co LTD.

There is shown a modulating structure which is located on a silicon substrate 11 on which is arranged a first set of opaque masks 12 separated by windows letting the light in. Shutters 13 having different sizes may be individually controlled so as to close one, two or more shutters and than mask and modulate the light lighting an optical sensor located under the shutters. The shutters are operated by means of a so-called PULL-IN voltage causing the application of an electrostatic force. Beyond one given threshold, the electrostatic force results a beam to be bent and stick on the surface of the silicon substrate, entailing an effect of modulation of the light going to the sensitive part of the optical sensor. In this first system known in the art, each shutter works in an ON/OFF state and the modulation of the light is achieved by means of one control of the addressing of the different shutters. Generally speaking, this first known device is particularly difficult to manufacture.

FIG. 2 illustrates a second known device which achieves the modulation of the light by means of the activation of a shutter 23 which moves in an horizontal direction and can mask all or part of a window letting the light in and go to the surface of a substrate 21 including optical sensors 22.

The devices which were mentioned above do not achieve the realization of an integrated modulator sensor, thus requiring the combination of a known sensor to the known modulators. This entails waste of space on the integrated circuit.

BRIEF SUMMARY

Generally speaking, it is desirable to achieve, by using conventional CMOS manufacturing techniques, a structure of a transistor which provides both the capabilities of a light sensor and the function of a light modulator.

Such is the goal of one embodiment.

One embodiment provides a structure of a component which achieves the two capabilities of a light sensor and a light modulator, thus reducing the space required in an integrated circuit.

Another embodiment provides a manufacturing process remaining close to the conventional CMOS manufacturing techniques and which still allow to realize one MOSFET modulating and sensing transistor.

One embodiment carries out a light modulating sensing MOSFET transistor comprising:
   a substrate receiving light radiation, said substrate having two source and drain areas separated by a channel extending along a first direction; and
   a gate conductive beam extending along a second direction being substantially perpendicular to said first direction, said beam being fixed at each of its two opposite ends on at least one supporting area and being located above the channel area.

The gate beam is substantially opaque and flexible so as to perform progressive modulation of the light reaching the channel in accordance with its bending controlled by the difference of voltage between said gate and the bulk and causing the beam to bend and to come closer to the surface of said channel.

One thus provides, in a very simple way, a MOSFET transistor which combines the functions of light sensor and light modulator and which can be manufacturing by conventional CMOS techniques. This permits to reduce the space used in the semiconductor product and also the manufacturing costs.

In one particular embodiment, the gate beam is fixed at its two opposite ends by two anchors located on Shallow Trench Insulator (STI) areas. Alternatively, the transistor can be manufactured on a Silicon On Insulator (SOI) substrate.

One embodiment provides a process for manufacturing a light modulating sensing MOS transistor comprising of:
   preparing one substrate on which is deposited a layer of sacrificial oxide;
   growing a poly-crystal silicon layer;
   etching said polycrystal silicon layer in order to form a flexible and substantially opaque beam having two anchors located on said substrate;
   creating source and drain zones located on both sides of said beam, said beam overhanging above the channel;
   eliminating said sacrificial oxide layer so as to release said overhanging beam;
   oxidizing said beam in order to set its electric properties; and
   deposit of at least one packaging layers.

In one particular embodiment, the oxidizing of the flexible beam is achieved by thermal oxidizing or by use of conformal oxide layer.

In one particular embodiment, the subsequent packaging of the light modulating sensing MOS transistor includes:
   sputtering a layer of amorphous silicon or conformal poly-silicon;
   deposit of a layer of oxide or nitride for the purpose of covering the amorphous silicon layer;
   opening contact vias above the drain, source and gate areas and metallizing said vias so as to achieved drain, source and gate electric contacts, respectively;
   opening release vias and eliminating the layer of amorphous silicon or conformal poly-silicon;
   deposit of a layer of non conformal oxide covering the metallization as well as the release vias.

BRIEF DESCRIPTION OF THE SEVERAL VIEWS OF THE DRAWINGS

Other features of one or more non-limiting and non-exhaustive embodiments will best be understood by reference to the following detailed description when read in conjunction with the accompanying drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
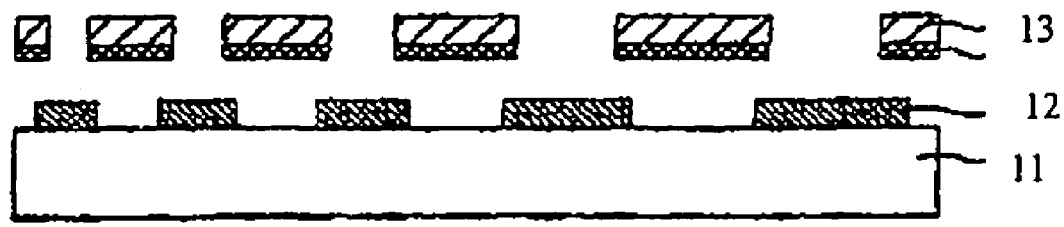
FIGS. 1 and 2 illustrate two structures of light modulators which are known in the background art.
Figure 2:
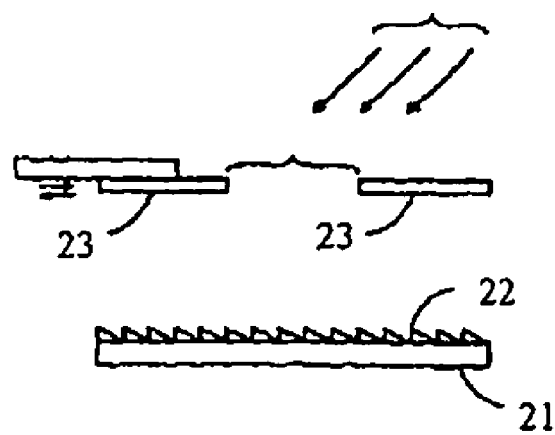
Figure 3:
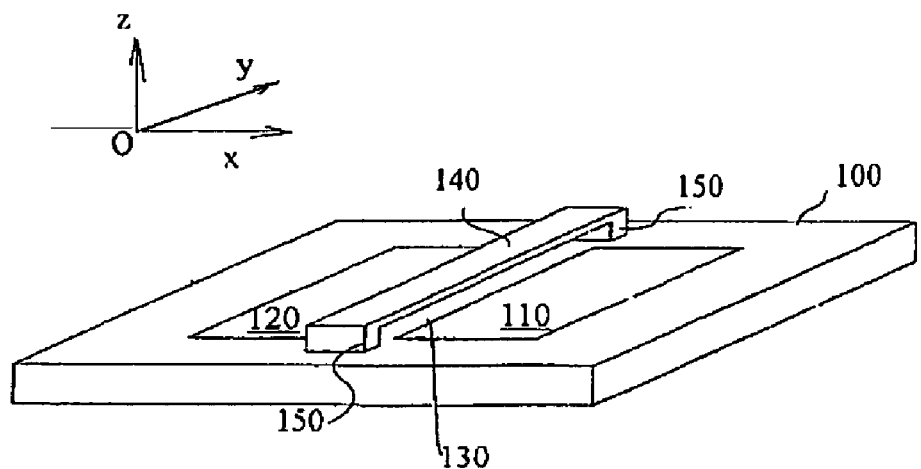
FIG. 3 illustrates one embodiment of a MOS light modulating and light sensing transistor.

FIG. 3 shows a perspective view of the structure of a MOSFET light sensing and modulating transistor in accordance with one embodiment.

The MOSFET transistor comprises one substrate 100 of semiconductor material, on which there is arranged two doped regions 110 and 120 respectively defining two source and drain regions. The two source and drain regions are separated from each other by a channel 130 which, as seen in FIG. 3, extends along a first O-x axis.

The MOS transistor further includes a gate beam 140— made of a conducting material being flexible and substantially opaque, which extends along an axis O-y which is perpendicular to axis 0-x. The gate beam extends above part of the channel 130.

Flexible gate beam 140 is fixed on substrate 100 by means of two anchors or supporting elements 150 allowing the bending of the beam above the region of the channel 130 in response to the application of an electrostatic force controlled by a voltage applied on the gate with respect to the bulk reference voltage, being considered as the ground.

Figure 4:
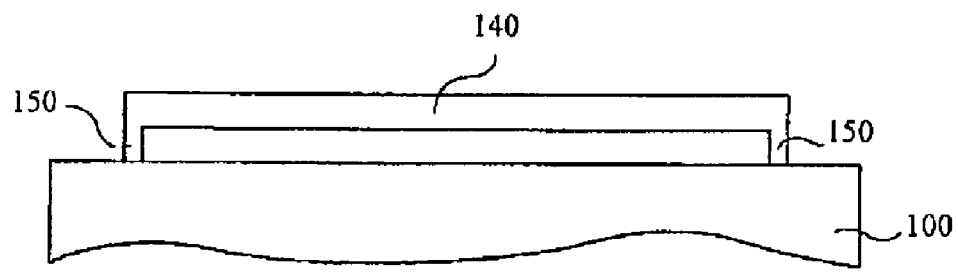
FIG. 4 shows an elevation of an opaque flexible beam which serves as a gate for the MOSFET transistor in accordance with one embodiment.
Figure 5:
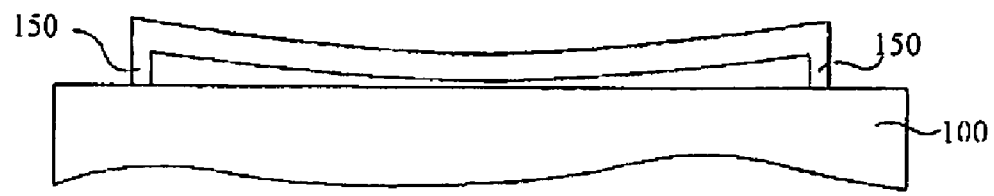
FIG. 5 illustrates the same elevation as that of FIG. 4, but showing the bending of the beam which reduces the amount of light going to the channel and, therefore, the inversion of said channel.

FIG. 4 illustrates the beam hanging unstressed, whereas FIG. 5 shows the same beam in a bent position.

When the electrostatic force produced by the gate voltage causes the bending of the opaque beam 140, this results in a change in the inversion phenomenon of channel, thus changing the Id(Vg) curve of the MOSFET transistor.

Figure 6:
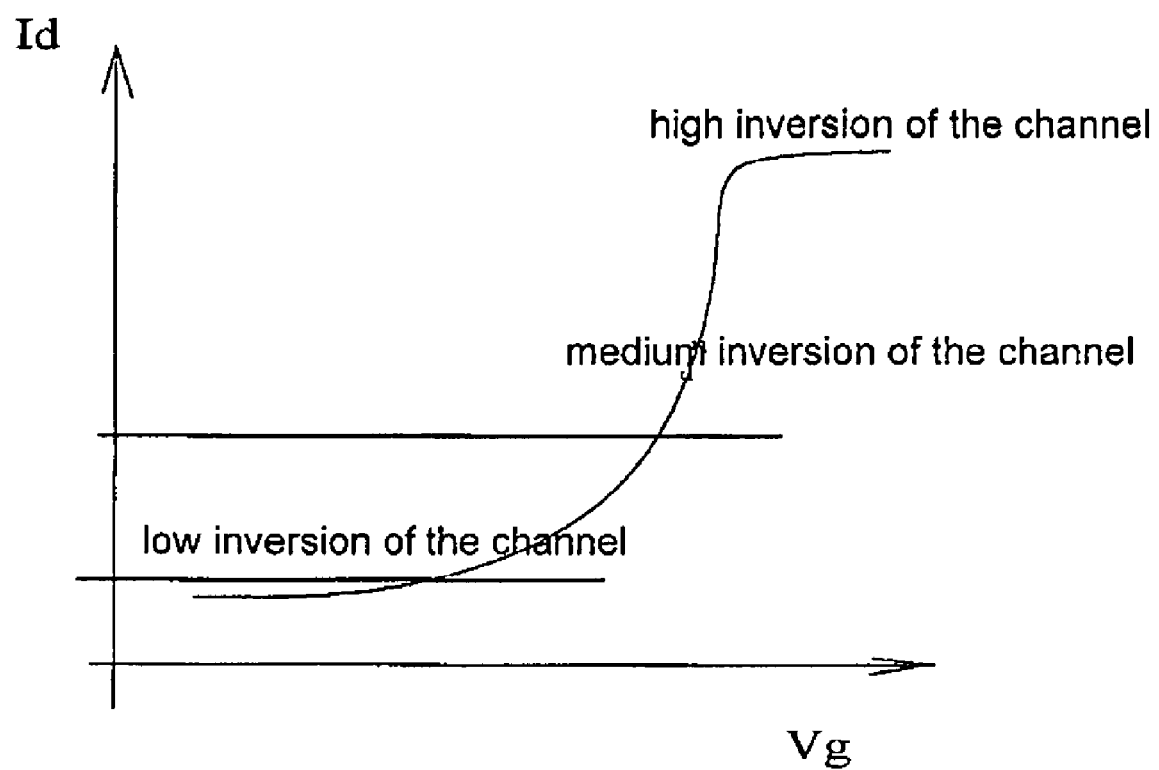
FIG. 6 is a chart illustrating the curve Id (Vg) of the MOSFET transistor according to one embodiment.

FIG. 6 illustrates the curve showing how the current Id depends on the voltage Vg of one MOSFET transistor. In one embodiment, the working area is situated in the first third of the "gap" (i.e., the distance between the gate and the gate oxide) which is useful for the bending of the beam while still maintaining that beam far enough from the surface of the substrate and thus avoiding the PULL-IN effect which was known in the conventional devices, with the sticking of the beam and thus the deterioration of the surface of the channel. With an embodiment, one prevents the "sticking" effect of the beam and thus avoid such deterioration.

Therefore, when the device is in darkness, one may observe a very weak current and, when one source of light is applied, one peak of one or two decades, which can be sensed very easily.

When the light substantially increases, one may notice an inversion of the channel and, consequently, one significant increase of the current Id in the channel.

The curve Id(Vg) is changed in a significant way when one bends beam 140 by means of one voltage applied on such beam with respect to the bulk voltage. Indeed, when the beam is bent as illustrated in FIG. 5, the latter covers a significant surface of the channel, thus reducing the inversion phenomenon which allows the conductivity of the MOSFET transistor. Thus, one achieves, by adjusting the voltage difference between gate and the bulk, progressively modulates the light which is applied on the surface of the channel of the transistor and, therefore, avoid any saturation of the sensing device when the light is too high.

In the rest and de-activated position, one may arrange the beam so as to have a slight bends towards the surface of the channel. Therefore, when the lights is particularly weak, one can also reduce the voltage applied to the gate so as to unbend the beam and move it away from the surface of the channel, thus allowing more light to be applied on the surface of the channel.

There is thus achieved, in a simple and effective way, the modulation of the light excising the sensor. The modulation is controlled by means of one single control voltage applied on the gate and does not require any complex control which was required in the above mentioned U.S. Patent Application Publication No. 2002047574, which was based on an addressing of the different shutters.

Generally speaking, the MOS modulating sensing transistor which was described can be manufactured by means of the conventional CMOS manufacturing techniques.

Figure 7A:
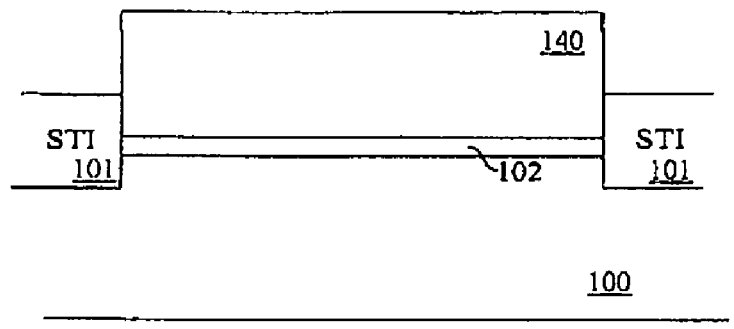
FIGS. 7a to 7j illustrate one first embodiment of a manufacturing process, from a conventional silicon substrate, of a MOSFET transistor.

There is described below one first manufacturing process of one MOSFET transistor in accordance with an embodiment, in reference to FIGS. 7a to 7e. In the description below, the preliminary manufacturing steps which are well known will not be discussed any further As shown in FIG. 7a, the manufacturing process starts with the preparation of one conventional substrate or bulk fitted with Shallow Trench Insulator (STI) 101 allowing the electric insulation of the different structures arranged on a same substrate. The so-called STI technique is well-known in the art and will not be developed any more. Substrate 100 is, for instance, made of monocrystal silicon (SI), having a sacrificial oxide layer 102, such as silicon-oxide $SiO_2$.

One performs a subsequent non selective epitaxial process leading to the formation of a polycrystal silicon 140.

Figure 7B:
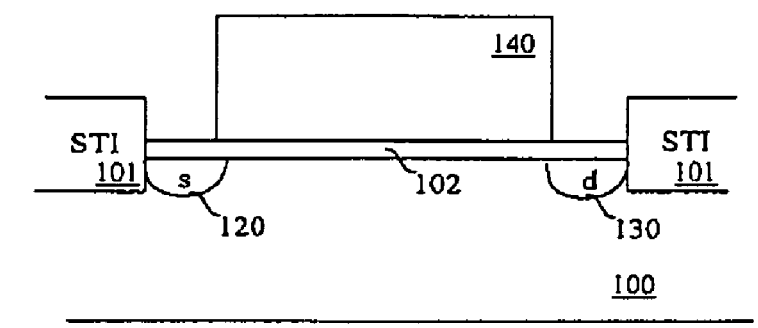

In a subsequent operation, as illustrated in FIG. 7b, one etches the polycrystal silicon layer so as to achieve the conductive gate beam 140 of FIG. 3. FIG. 7b does not illustrate the anchors or supporting elements 140 shown in FIG. 3 since those are located on both sides of the plane of FIG. 7b, ahead and backwards, and are located on the STI areas or even directly on the silicon substrate 100 after a selecting etching of the oxide area.

One then performs the implant of the source and drain areas, respectively 120 and 130, which are arranged on both sides of the gate beam so that the latter overhangs the channel area. Clearly, the practical implant step will determine the type of the transistor which will be manufactured, i.e., NMOS or PMOS. Moreover, one may adapt the implant energy according to the thickness of the oxide layer to come through. If the oxide layer 102 is particularly thick, one may consider a dry etching for instance, prior to the implant operation. All these techniques are well known and will not be further discussed.

Figure 7C:
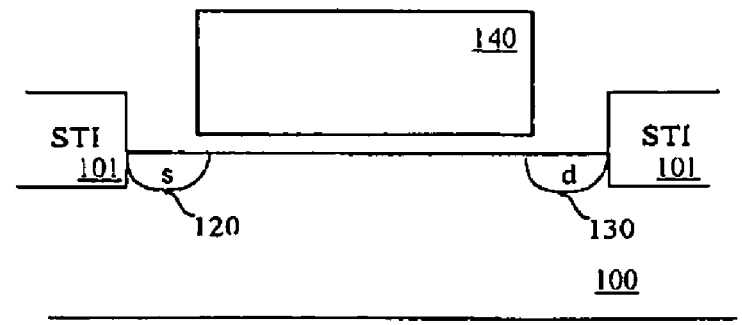
Figure 7D:
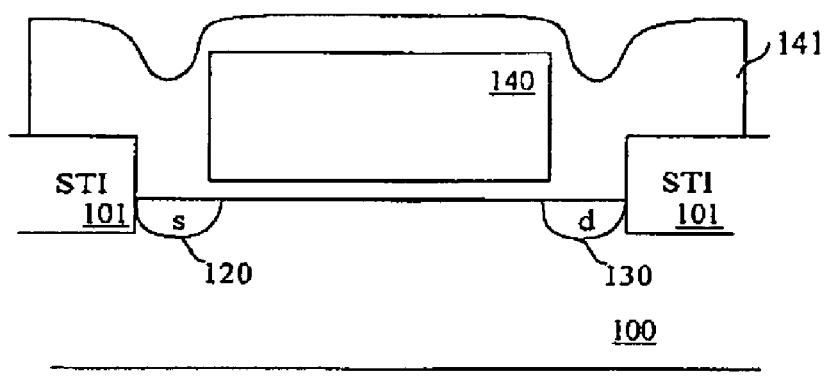

In a subsequent operation, illustrated in FIG. 7c, one eliminates the sacrificial oxide layer 102 by means of any appropriate known technique, such as, for instance, a wet etching based on a BHF acid.

One then performs a thermal oxidation or the deposit of an conformal oxide layer allowing to set the properties of the gate beam and the channel of the semiconductor transistor.

The structure of the gate beam is thus achieved and one completes the structure by means of an appropriate packaging, for instance, as illustrated in the FIGS. 7d to 7j.

This packaging operation starts with the sputtering of amorphous silicon which results in a sacrificial layer 141. Alternatively, one may grow a conformal polysilicon layer—i.e., without any preferential orientation—by means of well known techniques.

Figure 7E:
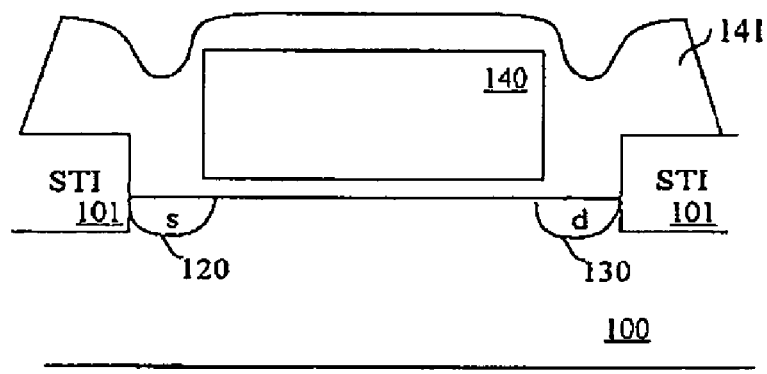

That layer 141 is then etched so as to form two sides on the bias, respectively to the left and to the right, of layer 141, as shown in FIG. 7e.

Figure 7F:
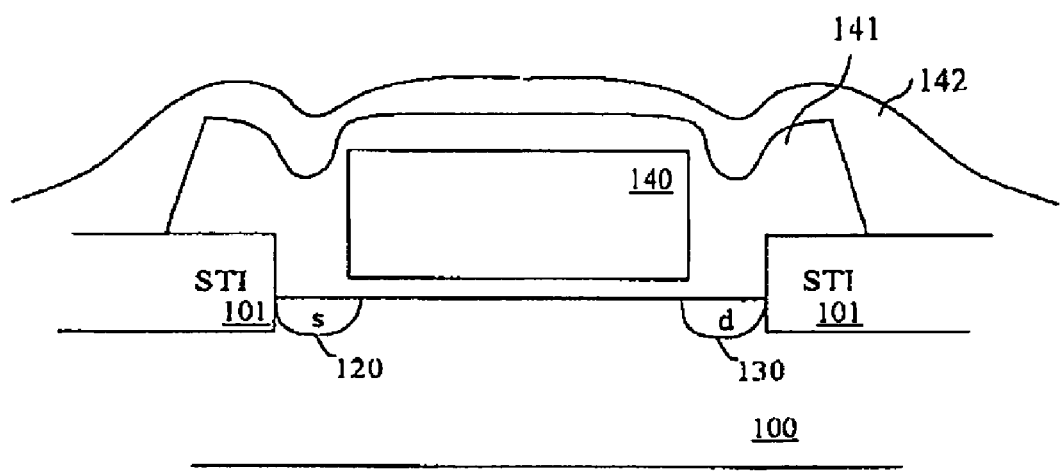

One then deposits, as illustrated in FIG. 7f, a structural layer 142 which permits the cover of the semiconductor product to be affixed, the latter being carried out by means of the growing of an appropriate layer of oxide or nitride.

Figure 7G:
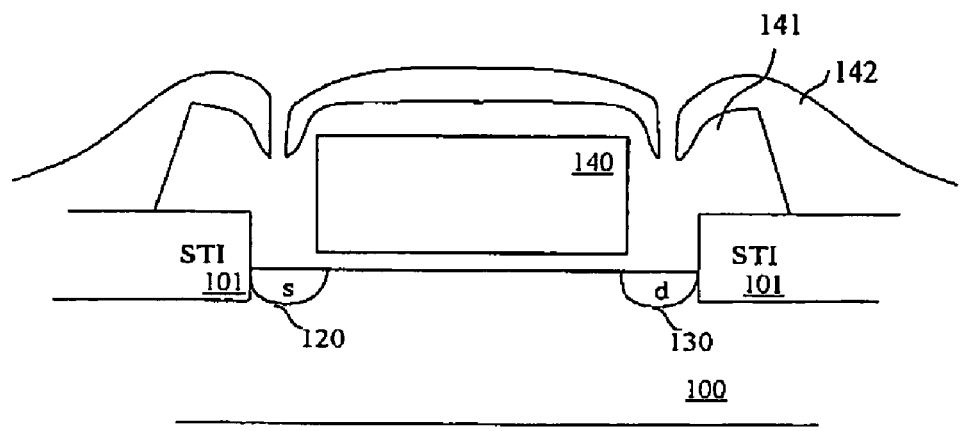
Figure 7H:
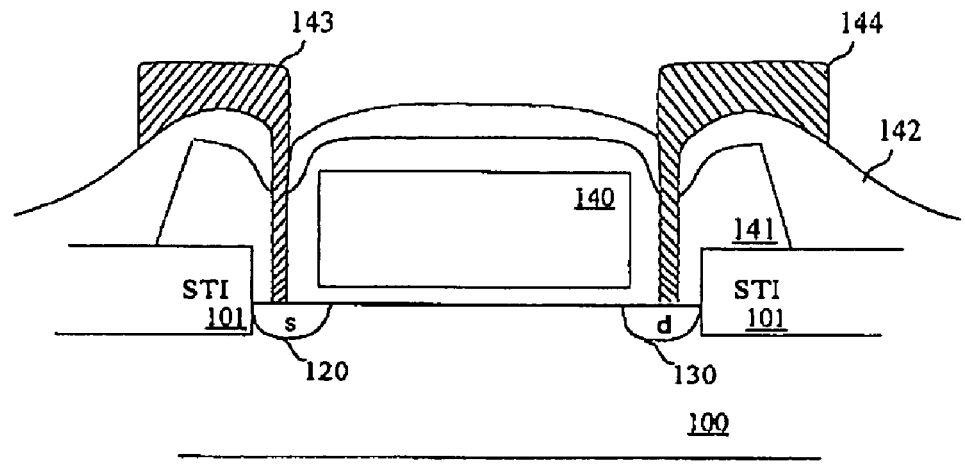

One then opens vias of contacts on the drain and source areas as illustrated in FIG. 7g. One may simply carry out one via on one of the anchors of the gate beam so as to achieve one gate contact (not shown in FIG. 7g). One thus performs a metallization of those contact vias in order to create contact terminals for the source, drain and gate areas. FIG. 7h illustrates the metallization of drain and source terminals, respectively carrying the reference numbers 143 and 144, achieving electrical contact with zones 120 and 130, respectively.

Figure 7I:
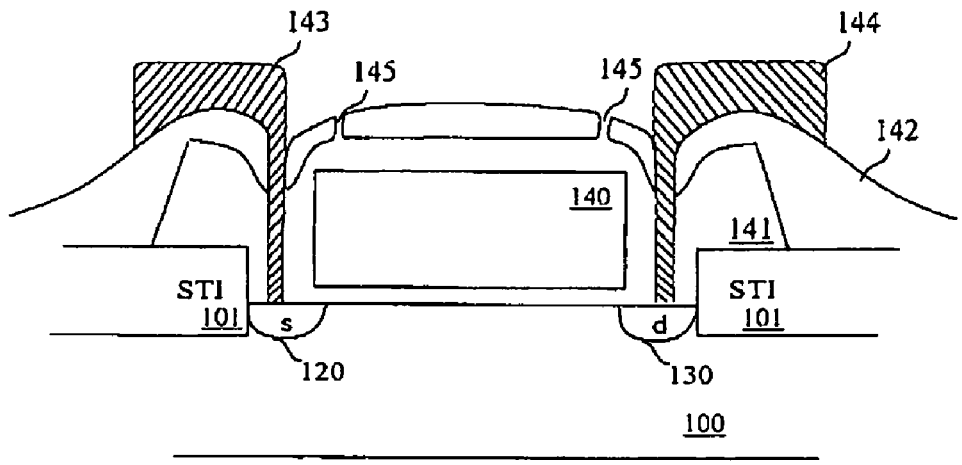

One then carry out release vias as shown in FIG. 7i, that is to say openings 145 of low section so as to allow an access to the sacrificial layer of amorphous silicon 141, which is then eliminated by well known dry etching techniques.

Figure 7J:
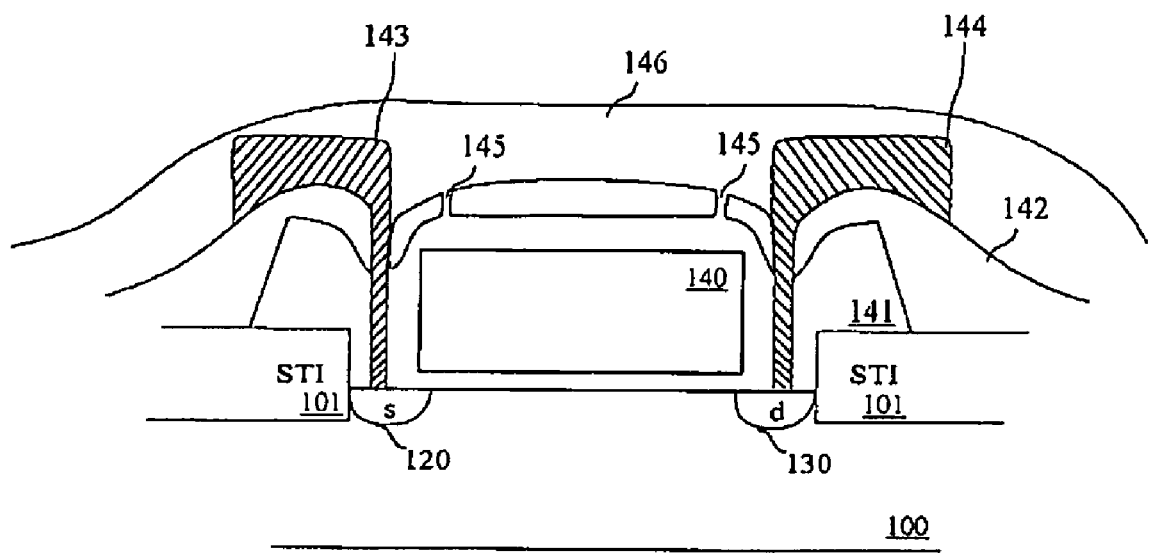
Figure 8A:
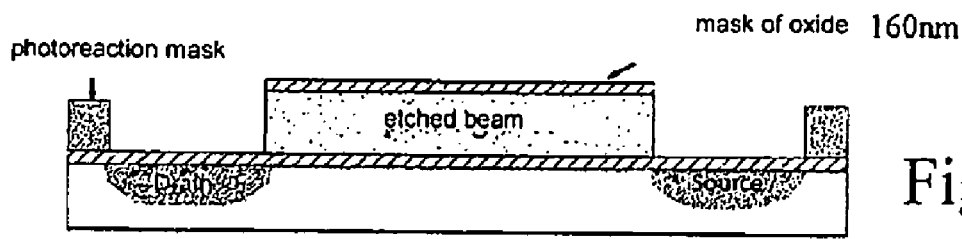
FIGS. 8a to 8h illustrate one second embodiment of a manufacturing process, from a convention Silicon on Insulator (SOI) substrate, of a MOSFET transistor.
Figure 8B:
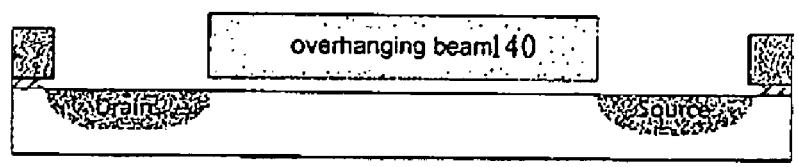
Figure 8C:
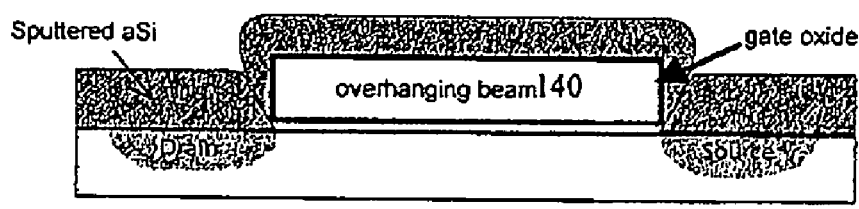
Figure 8D:
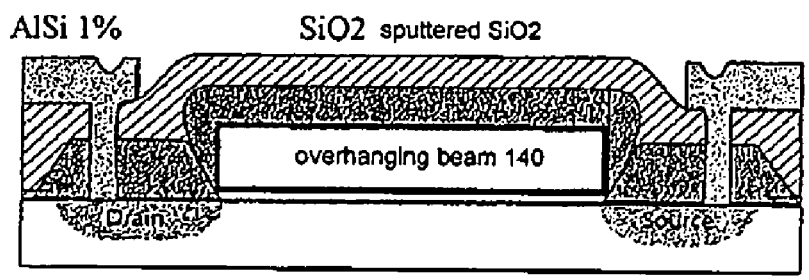
Figure 8E:
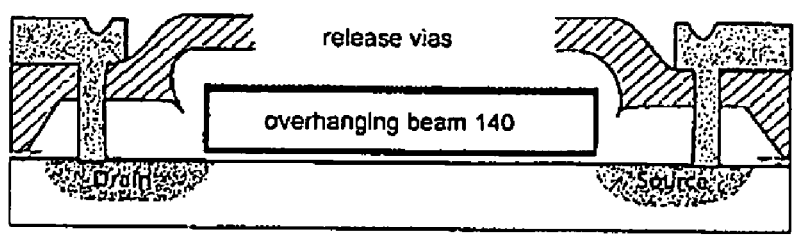
Figure 8F:
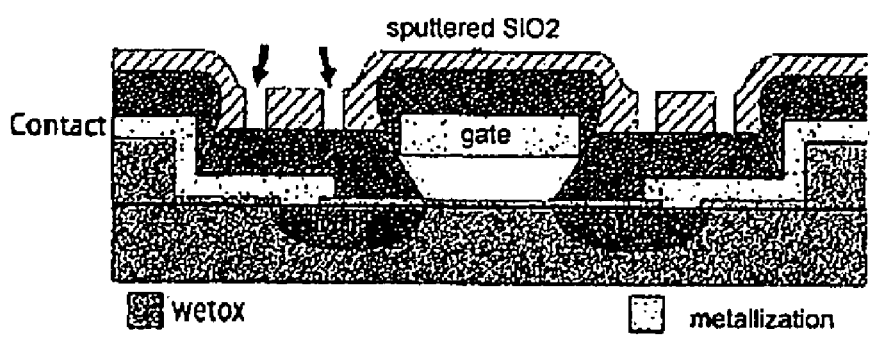
Figure 8G:
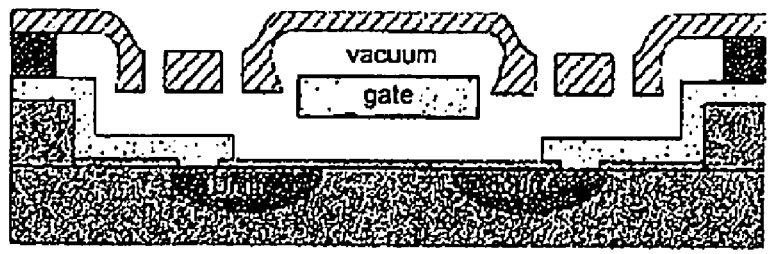
Figure 8H:
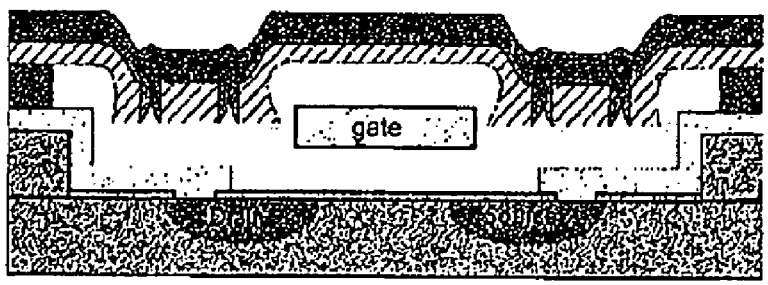

One then performs, as illustrated in FIG. 7j, the deposit of a layer of non conformal oxide 146 for the purpose of covering the metallization performed in the contact vias as well as in the openings of the release vias.

One thus obtains a sensing modulator MOS transistor which is properly packaged.

FIGS. 8a to 8e illustrate a second embodiment of the process based on the use of a Silicon on Insulator (SOI) substrate with a thin oxide layer and thin silicon layer. Such a SOI substrate has the advantage, as known in the art, to achieve electric insulation with respect to the substrates and, furthermore, to ascertain the growth of a mono-crystal type silicon.

One used a 200 nm thick SOI substrate with a Buried Oxide (BOX) layer having a thickness of 40 nm oxide layer and a layer of 100 nm non doped silicon. One performs then an epitaxis of a doped silicon layer with phosphorous having a thickness of 900 nm so as to achieve a doping profile which is uniform on the whole thickness. An oxide layer having a thickness of 160 nm is deposited at low temperature in order to form a mask for the etching of the beam. In order to dope the silicon layer having 100 nm thickness, one performs annealing.

For that operation, the thin oxide layer which serves as a mask avoids the amorphization of the silicon surface during annealing.

In order to etch the gate beam, one combines BHF etching with a Critical Point Drying (CPD) in order to avoid the sticking of the structure. The oxidation of the gate is performed by means of a dry oxidation of the overhanging beam.

When the beam is released, a protection against water by also against any deterioration that might result from the subsequent metallization process is achieved and, for this purpose, one uses sputtered amorphous silicon which provides efficient and satisfactory protection while avoiding, however, to fill in the cavity under the overhanging beam, thus facilitating the packing of the whole structure. This operation of sputtering with an amorphous silicon at low temperature has shown to have limited effect on the active part of the device.

This operation has also the significant advantage of providing protection of the gate oxide for the subsequent manufacturing process steps.

From a practical point of view, one etched this layer and the substrate was covered by an oxide having a thickness of 1.8 µm which was sputtered at room temperature. Even deposited at low temperature, the oxide shows a satisfactory conformal property around the corners of the hanging beam.

The contacts are etched through the thick oxide and 1% AlSi stamps are sputtered at room temperature were etched above that oxide. Annealing at 400° C. was then performed on the AlSi compound so as to reduce the value of the contact resistance. The last masking step consisted in the opening of the oxide by means of dry etching in order to reach the sacrificial amorphous silicon.

The final release of the beam was achieved by chemical etching with SF6 plasma, which permitted high selectivity for the thin gate oxide surrounding the silicon gate.

The packaging process comprises the sputtering on the overhanging beam of a layer of amorphous silicon oxide (aSi) having a thickness of 5 µm, then followed by a sputtering of a 2 µm film of SiO2 silicon oxide. There is performed the deposit of a film of aSi without any stress, the almost vertical deposit achieving the deposit of material under the ray, thus reducing the time for release.

Release vias having a thickness of 1.5 µm were etched through the layer of $SiO_2$ and the release step was achieved with SF6 dry plasma. Pure chemical etching achieved selectivity inferior than 1 nm/min on the silicon oxide layer. At last, the vias were closed by means of a deposit of non conformal SiO2 deposit at room temperature.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light modulating sensing transistor, comprising:
   a substrate to receive light, said substrate having two source and drain areas separated by a channel extending along a first direction; and
   a gate conductive beam extending along a second direction being substantially perpendicular to said first direction, said beam being fixed at each of its two opposite ends on at least one supporting area and being located above the channel area, said gate beam being substantially opaque and flexible so as to perform progressive modulation of the light reaching the channel in accordance with bending of said gate beam controlled by a difference of voltage between said gate beam and a bulk and causing the beam to bend and to come closer to a surface of said channel.

2. The transistor according to claim 1 wherein said gate beam is fixed at its two opposite ends by two anchors being located on Shallow Trench Insulator areas.

3. The transistor according to claim 1 wherein said substrate is a Silicon On Insulator substrate.

4. The transistor according to claim 1 wherein said transistor is a MOSFET transistor of NMOS type.

5. The transistor according to claim 1 wherein said transistor is a MOSFET transistor of PMOS type.

6. A process for manufacturing a modulating sensing transistor, the process comprising:
   preparing one substrate having a layer of sacrificial oxide;
   growing a polycrystal silicon layer;
   etching said polycrystal silicon layer to form a flexible and substantially opaque beam having two anchors located on said substrate;
   creating source and drain zones located on both sides of said beam, said beam overhanging above a channel;
   eliminating said sacrificial oxide layer so as to release said overhanging beam;
   oxidizing said beam to set its electric properties; and
   depositing at least one packaging layer.

7. The process according to claim 6 wherein eliminating said sacrificial oxide layer is achieved by wet etching based on a BHF acid.

8. The process according to claim 6 wherein said oxidizing the flexible beam is achieved by thermal oxidizing or by use of conformal oxide layer.

9. The process according to of claim 6 wherein said packaging includes:
   sputtering a layer of amorphous silicon or conformal poly-silicon;
   depositing a layer of oxide or nitride to cover the layer of amorphous silicon or conformal poly-silicon;
   opening contact vias above drain, source and gate zones and metallizing said vias so as to achieve drain, source and gate electric contacts, respectively;
   opening release vias and eliminating the layer of amorphous silicon or conformal poly-silicon; and
   depositing a layer of non conformal oxide to cover the metallization as well as the release vias.

10. A light modulating and sensing circuit, comprising:
    a set of transistors each including:
       a substrate to receive light, said substrate having two source and drain areas separated by a channel extending along a first direction; and
       a gate conductive beam extending along a second direction being substantially perpendicular to said first direction, said beam being fixed at each of its two opposite ends on at least one supporting area and being located above the channel area, said gate beam being substantially opaque and flexible so as to perform progressive modulation of the light reaching the channel in accordance with bending of said beam as controlled by a voltage difference that causes the beam to bend and to come closer to a surface of said channel.

11. The circuit of claim 10 wherein at least one of said transistors is a PMOS type MOSFET transistor.

12. The circuit of claim 10 wherein at least one of said transistors is a NMOS type MOSFET transistor.

13. The circuit of claim 10 wherein said voltage difference is a voltage difference between said gate beam and a bulk.

14. The circuit of claim 10, further comprising:
    a structural layer overlying said gate beam and having vias;
    metallization in each of said vias that are respectively electrically coupled to said source and drain areas; and
    a cover layer overlying said metallization.

15. A light modulating apparatus, comprising:
    a substrate to receive light, said substrate having source and drain areas separated by a channel extending along a first direction; and
    a gate conductive beam extending along a second direction being substantially perpendicular to said first direction, said beam being fixed to at least one supporting area of said substrate and being located above the channel area, said gate beam being electrically controllable to bend towards a surface of said channel so as to perform progressive modulation of the light reaching the channel.

16. The apparatus of claim 15 wherein said substrate and gate conductive beam are parts of a MOS type transistor.

17. The apparatus of claim 15 wherein said beam includes first and second ends that are respectively anchored to corresponding said at least one supporting area of said substrate.

18. The apparatus of claim 15 wherein said gate beam is electrically controllable according to a voltage difference between said gate beam and a bulk region.

19. The apparatus of claim 15 wherein said substrate is a silicon on insulator (SOI) substrate.

20. The apparatus of claim 15, further comprising:
    a structural layer overlying said gate beam and having vias;
    metallization in each of said vias that are respectively electrically coupled to said source and drain areas; and
    a cover layer overlying said metallization.

* * * * *